(12) United States Patent
Liu (10) Patent No.: US 10,033,123 B2
(45) Date of Patent: Jul. 24, 2018

(54) INTERFACE CARD FASTENING MODULE

(71) Applicant: Wistron Corporation, New Taipei (TW)

(72) Inventor: Li Liu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 15/854,449

(22) Filed: Dec. 26, 2017

(65) Prior Publication Data
US 2018/0123269 A1    May 3, 2018

Related U.S. Application Data

(62) Division of application No. 15/258,183, filed on Sep. 7, 2016, now Pat. No. 9,917,384, which is a division of application No. 14/804,434, filed on Jul. 21, 2015, now Pat. No. 9,524,001.

(30) Foreign Application Priority Data

Dec. 25, 2014 (CN) ..................... 2014 2 0840838 U (51) Int. Cl.
| | |
|---|---|
| *H01R 13/64* | (2006.01) |
| *H01R 12/70* | (2011.01) |
| *H01R 12/73* | (2011.01) |
| *H05K 7/14* | (2006.01) |
| *G06F 1/16* | (2006.01) |

(52) U.S. Cl.
CPC .......... *H01R 12/7058* (2013.01); *G06F 1/16* (2013.01); *H01R 12/732* (2013.01); *H05K 7/1487* (2013.01)

(58) Field of Classification Search
CPC ............ H01R 23/7068; H01R 23/7005; H01R 23/682; H01R 13/631; H05K 7/1418; G06F 1/184; G06F 1/186
USPC ..... 439/59–62, 64, 326–328, 374, 377, 630; 361/756, 759, 801, 802
See application file for complete search history.

(56) References Cited

U.S. PATENT DOCUMENTS

| | | | | |
|---|---|---|---|---|
| 7,074,090 B2 * | 7/2006 | Ho | .......................... | H01R 12/52 |
| | | | | 439/326 |
| 7,182,618 B1 * | 2/2007 | Choy | ................... | H05K 7/1404 |
| | | | | 439/108 |
| 7,300,298 B2 * | 11/2007 | Kameda | ............... | H05K 7/1417 |
| | | | | 439/326 |

(Continued)

*Primary Examiner* — Thanh Tam Le
(74) *Attorney, Agent, or Firm* — McClure, Qualey & Rodack, LLP (57) ABSTRACT

An interface card fastening module is provided for assembling an interface card to a housing and for electrically connecting the interface card with a main board, wherein the main board has an interface card insertion slot corresponding to the interface card, and a plane defined extendingly from an opening of the interface card insertion slot is substantially parallel to the main board. The interface card fastening module includes an engaging member disposed at the housing so as to be movable between a release position and an engage position, wherein the engaging member comprising a body, at least one lock portion, and an extension plate. A first clamping portion is disposed at a side wall of the housing, and a second clamping portion is disposed at a base plate of the housing in which the base plate is perpendicular to the side wall of the housing.

5 Claims, 12 Drawing Sheets

(56) References Cited

U.S. PATENT DOCUMENTS

| | | | |
|---|---|---|---|
| 7,467,963 B2 * | 12/2008 | Chen | H01R 13/631 |
| | | | 439/327 |
| 7,554,816 B2 * | 6/2009 | Chang | H05K 7/1417 |
| | | | 361/759 |
| 7,717,727 B2 * | 5/2010 | Li | H01R 12/7005 |
| | | | 439/328 |
| 8,184,451 B2 * | 5/2012 | Chan | G06F 1/186 |
| | | | 361/801 |
| 8,417,744 B2 * | 4/2013 | Plancarte | G06F 12/0269 |
| | | | 707/813 |
| 8,579,645 B2 * | 11/2013 | Wang | H01R 12/83 |
| | | | 439/326 |
| 8,657,619 B2 * | 2/2014 | Lin | G06F 1/185 |
| | | | 439/326 |
| 8,764,457 B2 * | 7/2014 | Chen | H05K 7/142 |
| | | | 361/810 |

* cited by examiner

INTERFACE CARD FASTENING MODULE

CROSS-REFERENCES TO RELATED APPLICATIONS

This application is a Division of application Ser. No. 15/258,183, filed on Sep. 7, 2016, which is a Division of application Ser. No. 14/804,434, filed on Jul. 21, 2015 which claimed foreign priority to CN 201420840838.7. The prior applications are herewith incorporated by reference in their entireties.

BACKGROUND

Technical Field

The instant disclosure relates to an interface card fastening module, in particular, to an interface card fastening module without expansion cards.

Related Art

Nowadays computer motherboards have various interface card insertion slots with different specifications for mating with different interface cards. Commonly, an interface card may be assembled to the motherboard by directly inserting the PCB connector (also called the golden finger) of the interface card into the corresponding interface card insertion slot of the motherboard.

However, regarding some thin computers, such as a 1U-height rack server, the space in the housing of the rack server is small and the height of the housing is insufficient to allow the interface card to be perpendicularly installed to the motherboard of the rack server. An existing solution is to insert an adapting circuit board to the interface card insertion slot, and the PCB connector of the interface card is inserted into an expansion interface insertion slot of the adapting circuit board to allow the interface card parallel to the motherboard. Therefore, interface cards can be installed to the motherboard of the rack server through the adapting circuit board.

Nevertheless, the adapting circuit board would be needed for the foregoing solution, and the space for assembling the adapting circuit board is also necessary. In addition, the manufacturing cost would be increased due to the material cost of the adapting circuit board.

SUMMARY

In view of these, the instant disclosure provides an interface card fastening module for assembling an interface card to a housing and for electrically connecting the interface card with a main board. The main board has an interface card insertion slot corresponding to the interface card, and the plane defined extendingly from the opening of the interface card insertion slot is substantially parallel to the main board (i.e., the top surface of the main board). The interface card fastening module comprises an engaging member and a stopping member. The engaging member is rotatably pivoted on the housing so as to be movable between a release position and an engage position. The engaging member has a side wall and an engaging groove. An opening of the engaging groove is distant from the side wall. The stopping member is disposed at the housing and near the engaging member. Wherein, when the engaging member is at the engage position, the engaging groove clamps the interface card and the side wall is abutted against the stopping member.

The instant disclosure also provides an interface card fastening module for assembling an interface card to a housing and for electrically connecting the interface card with a main board. The main board has an interface card insertion slot corresponding to the interface card, and the plane defined extendingly from an opening of the interface card insertion slot is substantially parallel to the main board (i.e., the top surface of the main board). The interface card fastening module comprises a body, an engaging member, and a second engaging groove. The body is disposed at the housing. The engaging member is flexibly disposed at one of two ends of the body so as to be movable between a release position and an engage position. The engaging member has a first engaging groove. The second engaging groove is defined at the other end of the body. Wherein, when the interface card is assembled to the interface card fastening module, the interface card is inserted into the second engaging groove, and the first engaging groove clamps the interface card when the engaging member is at the engage position.

The instant disclosure further provides an interface card fastening module for assembling an interface card to a housing and for electrically connecting the interface card with a main board. The main board has an interface card insertion slot corresponding to the interface card, and the plane defined extendingly from an opening of the interface card insertion slot is substantially parallel to the main board (i.e., the top surface of the main board). The interface card fastening module comprises an engaging member, a first clamping portion, and a second clamping portion. The engaging member is disposed at the housing so as to be movable between an engage position and a release position. The engaging member comprises a body, at least one lock portion, and an extension plate. The lock portion is perpendicularly extending from the body, and the extension plate is perpendicularly extending from the body and parallel to the lock portion. The first clamping portion is disposed at a side wall of the housing. The second clamping portion is disposed at a base plate of the housing in which the base plate is perpendicular to the side wall of the housing. The interface is locked with the lock portion. When the engaging member is at the engage position, the first clamping portion clamps the body and the second clamping portion clamps the extension plate.

As above, since the plane defined extendingly from the opening of the interface card insertion slot is substantially parallel to the main board (i.e., the top surface thereof) rather than perpendicular to the main board, the interface card can be installed to the main board with parallel alignment. Therefore, upon assembling the interface card to the main board, an additional adapting member would be not required for changing the assembling direction of the interface card since the assembling direction of the interface card has been changed by the interface card fastening module. As a result, the space for installing an adapting member can be reserved for other components, or, alternatively, the size of the housing may be reduced. On the other hand, since the adapting member is no more needed, the manufacturing cost and assembling hours for the adapting member can be saved. Besides, because the interface card fastening module secures the interface card in an easy way, a user can assemble and disassemble the interface card to the main board easily.

Detailed description of the characteristics and the advantages of the disclosure is shown in the following embodiments, the technical content and the implementation of the disclosure should be readily apparent to any person skilled in the art from the detailed description, and the purposes and the advantages of the disclosure should be readily understood by any person skilled in the art with reference to content, claims and drawings in the disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
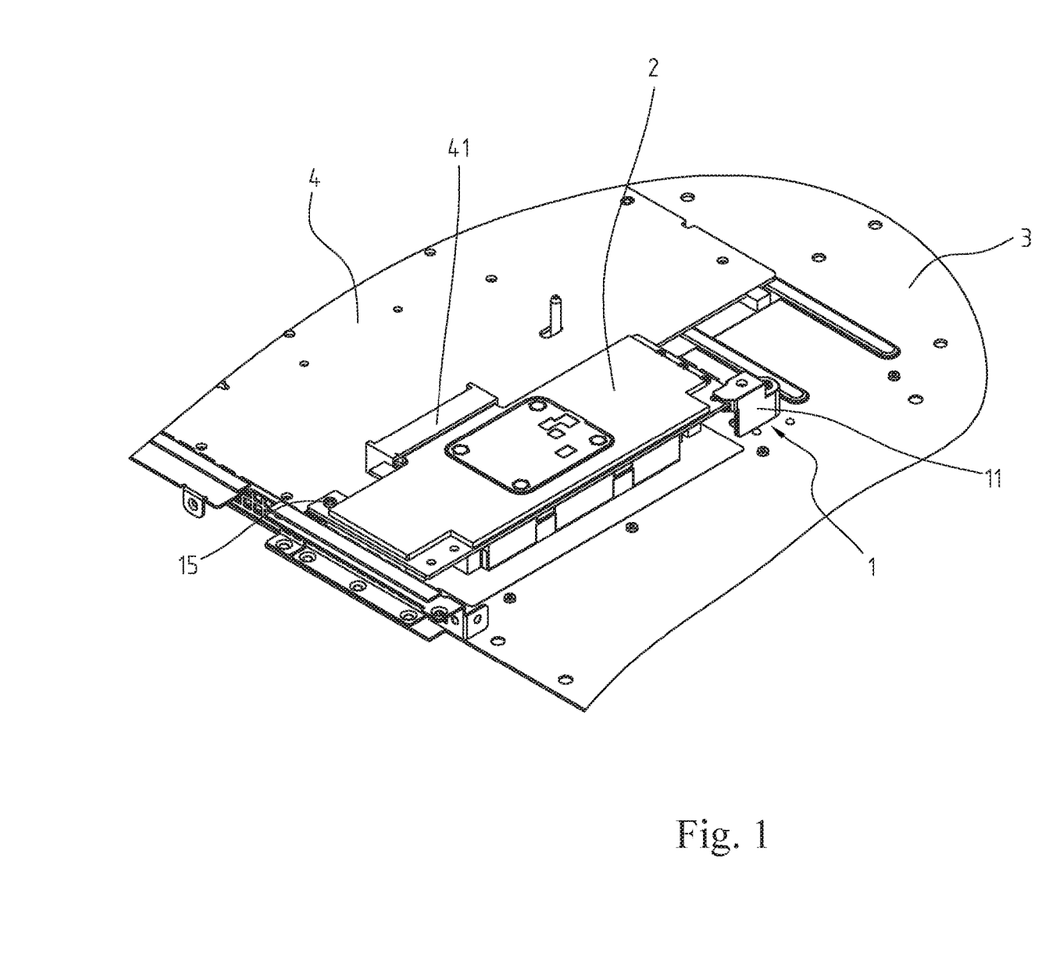
FIG. 1 is a perspective view of an interface card fastening module according to a first embodiment of the instant disclosure.
Figure 2:
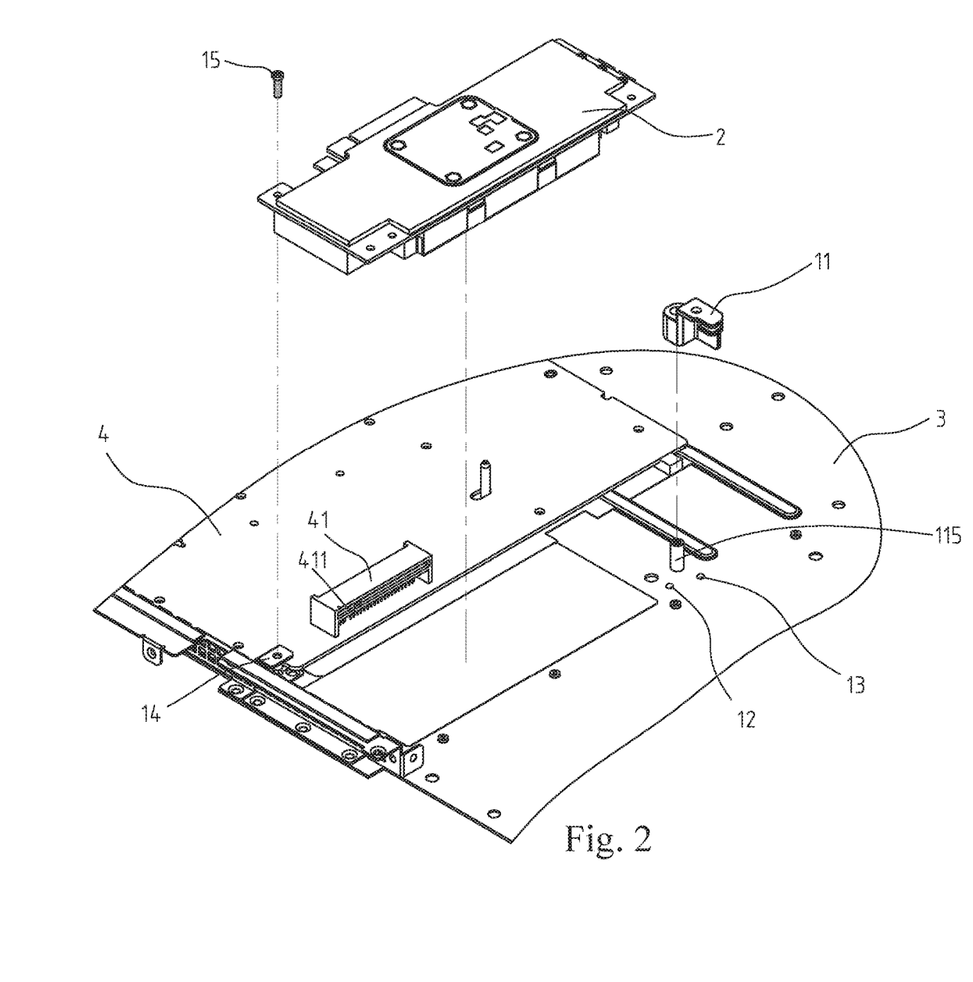
FIG. 2 is an exploded view of the interface card fastening module according to the first embodiment of the instant disclosure.
Figure 3:
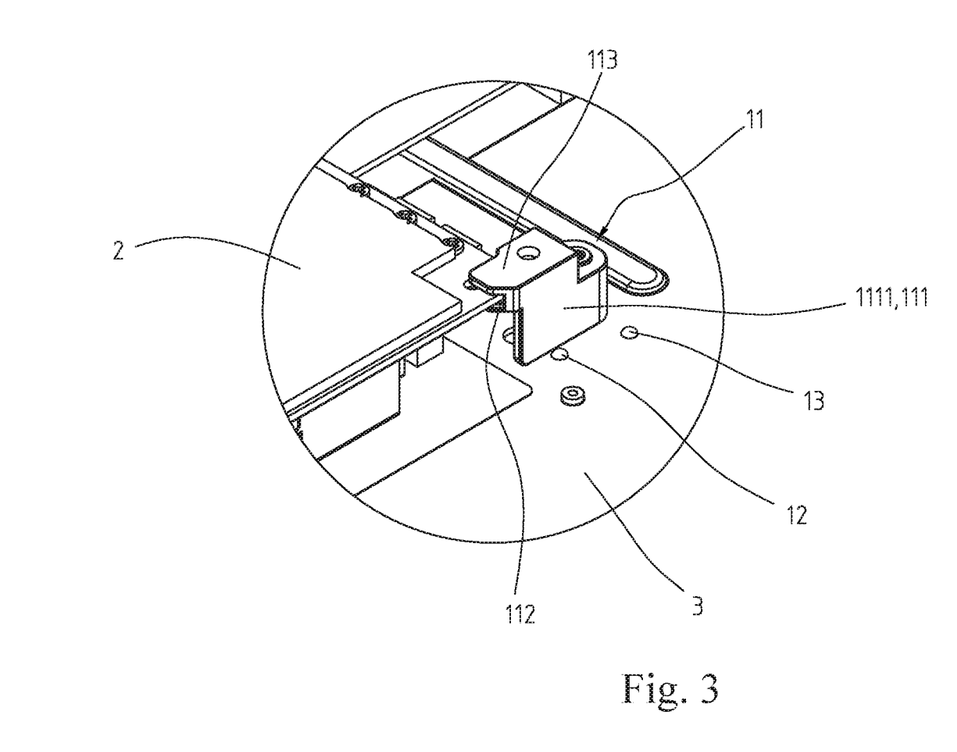
FIG. 3 is an enlarged view illustrating an engaging member of the interface card fastening module shown in FIGS. 1 and 2 is at an engage position.
Figure 4:
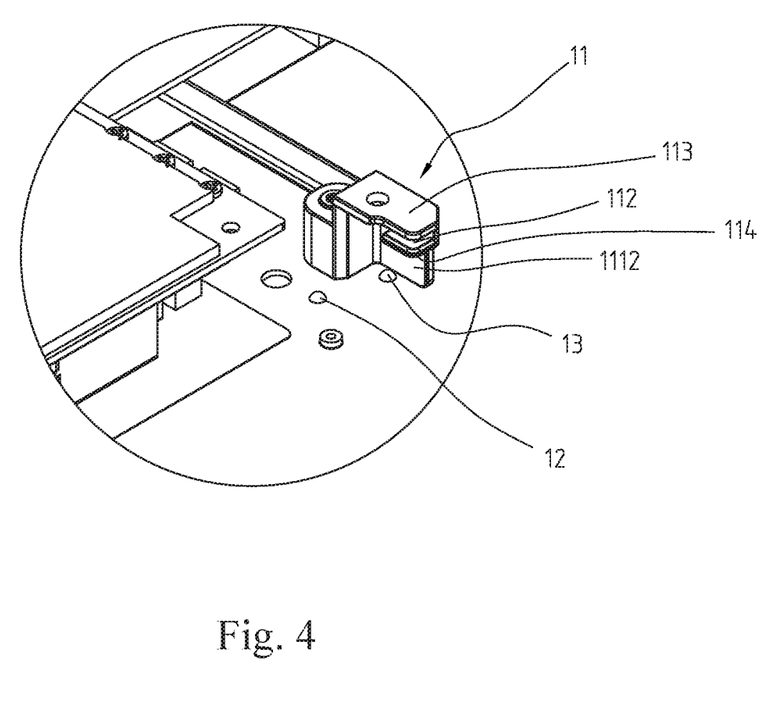
FIG. 4 is an enlarged view illustrating the engaging member of the interface card fastening module shown in FIGS. 1 and 2 is at a release position.

Please refer to FIGS. 1 to 4. FIG. 1 is a perspective view of an interface card fastening module 1 according to a first embodiment of the instant disclosure. FIG. 2 is an exploded view of the interface card fastening module 1. FIG. 3 is an enlarged view illustrating an engaging member 11 of the interface card fastening module 1 is at an engage position. FIG. 4 is an enlarged view illustrating the engaging member 11 of the interface card fastening module 1 is at a release position.

The interface card fastening module 1 is configured to a housing 3 for assembling an interface card 2 and to allow the interface card 2 to be electrically connected with a main board 4 configured to the housing 3. As shown in FIG. 2, the main board 4 has an interface card insertion slot 41 corresponding to the interface card 2, and the plane defined extendingly from the opening of the interface card insertion slot 41 is substantially parallel to the main board 4 (i.e., the top surface of the main board). Here, unlike the typical alignment where the interface card 2 is perpendicularly installed to the main board 4, the plane defined extendingly from the opening of the interface card insertion slot 41 in the instant embodiment is aligned to be parallel to the main board 4. Therefore, upon assembling the interface card 2 to the main board 4, an additional adapting member would be not required for changing the assembling direction of the interface card 2 since the assembling direction of the interface card 2 has been changed by the interface card fastening module 1 according to the instant embodiment.

Please refer to FIGS. 2 to 4. The interface card fastening module 1 comprises an engaging member 11, a first stopping member 12, and a second stopping member 13. The engaging member 11 is rotatably pivoted on the housing 3 via a pivot shaft 115, so that the engaging member 11 is movable between a release position (as shown in FIG. 3) and an engage position (as shown in FIG. 4). The engaging member 11 has a side wall 111 and an engaging groove 112. The side wall 111 is located at one side of the engaging groove 112, so that the engaging groove 112 clamps the interface card 2 when the engaging member 11 is at the engage position. Specifically, an opening of the engaging groove 112 is distant from the side wall 111, when the engaging member 11 is at the engage position, the side wall 111 would also be abutted against the interface card 2.

The first stopping member 12 is disposed at the housing 3 and near the engaging member 11. Here, the first stopping member 12 is an arc shaped protrusion protruded from the housing 3, but are not limited thereto. When the engaging member 11 is at the engage position, the side wall 111 of the engaging member 11 is abutted against the first stopping member 12. Accordingly, the first stopping member 12 provides a securing force to the engaging member 11 to prevent the engaging member 11 from detaching off the engage position when the engaging member 11 is shaken or when the housing 3 is moved.

Based on the interface card fastening module 1 according to the instant embodiment, without the aids of any additional adapting member, the interface card 2 can be assembled to the housing 3 with the assembling direction parallel to the main board 2. After the interface card 2 is inserted into the interface card insertion slot 41, the engaging member 11 can be rotated to the engage position to secure the interface card 2. In addition, the first stopping member 12 would prevent the engaging member 11 from detaching off the engage position. Therefore, the space for installing an adapting member can be reserved for other components, or, alternatively, the size of the housing 3 may be reduced. On the other hand, since the adapting member is no more needed for the instant embodiment, the manufacturing cost and assembling hours for the adapting member can be saved. Besides, because the interface card fastening module 1 secures the interface card 2 in an easy way, a user can assemble and disassemble the interface card 2 to the main board 4 easily.

Please refer to FIG. 4. The second stopping member 13 is also disposed at the housing 3 and near the engaging member 11. When the engaging member 11 is rotated to the release position, the side wall 111 of the engaging member 11 is abutted against the second stopping member 13. Accordingly, when the engaging member 11 is rotated to the release position, the engaging member 11 may be temporarily secured at the release position. As a result, in the case that the interface card 2 is not assembled to the main board 4, the engaging member 11 would not be rotated freely to impact other components and to produce noises when the housing 3 is being moved.

Hereinafter, the structure of the engaging member 11 will be described in detail. Please refer to FIGS. 3 and 4. The side wall 111 of the engaging member 11 has a first surface 1111 and a second surface 1112 parallel to the first surface 1111. When the engaging member 11 is at the engage position (as shown in FIG. 3), the first surface 1111 of the side wall 111 is abutted against the first stopping member 12 to prevent the engaging member 11 from detaching off the engage position. While when the engaging member 11 is rotated to the release position (as shown in FIG. 4), the second surface 1112 of the side wall 111 is abutted against the second stopping member 13 to position the engage member 11 at the release position temporarily.

Additionally, in this embodiment, the engaging member 11 further comprises a first blocking plate 113 and a second blocking plate 114. The first blocking plate 113 is perpendicularly extending from the second surface 1112 of the side wall 111. The second blocking plate 114 is also perpendicularly extending from the second surface 1112 of the side wall 111 and parallel to the first blocking plate 113. The first blocking plate 113 and the second blocking plate 114 may be same sized, but embodiments are not limited thereto. The first blocking plate 113, the side wall 111, and the second blocking plate 114 define the engaging groove 112. When the engaging member 11 is rotated to the engage position, the first blocking plate 113 and the second blocking plate 114 are provided for respectively clamping two opposite planes of the interface card 2, and the side wall 111 is provided for abutting against the interface card 2.

Please refer to FIG. 2. To firmly secure the interface card 2 to the main board 4, the interface card fastening module 1 further comprises an auxiliary member 14 disposed at the housing 3 and near the interface card insertion slot 41. When the interface card 2 is inserted into the interface card insertion slot 41, a portion of the interface card 2 (here, the corner of the interface card 2) is disposed upon the auxiliary member 14, and a locking member 15 is provided to lock the interface card 2 with the auxiliary member 14. Therefore, the securing of the interface card 2 can be further improved. Here, the auxiliary member 14 is in a shape of a rectangular plate, and the height of the auxiliary member 14 is configured to allow the interface card 2 to be fastened on the housing 3 via the auxiliary member 14 when the interface card 2 is inserted into the interface card insertion slot 41. Alternatively, the auxiliary member 14 may be a protruded rod, but embodiments are not limited thereto. In addition, in this embodiment, the engaging member 11 and the auxiliary member 14 are configured substantially at one of the diagonal lines of the interface card 2, such that the interface card 2 can be secured firmly. In another embodiment, the engaging member 11 and the auxiliary member 14 may not be exactly configured at the diagonal line of the interface card. In other words, the positions of the engaging member 11 and the auxiliary member 14 may be adjusted.

Figure 5:
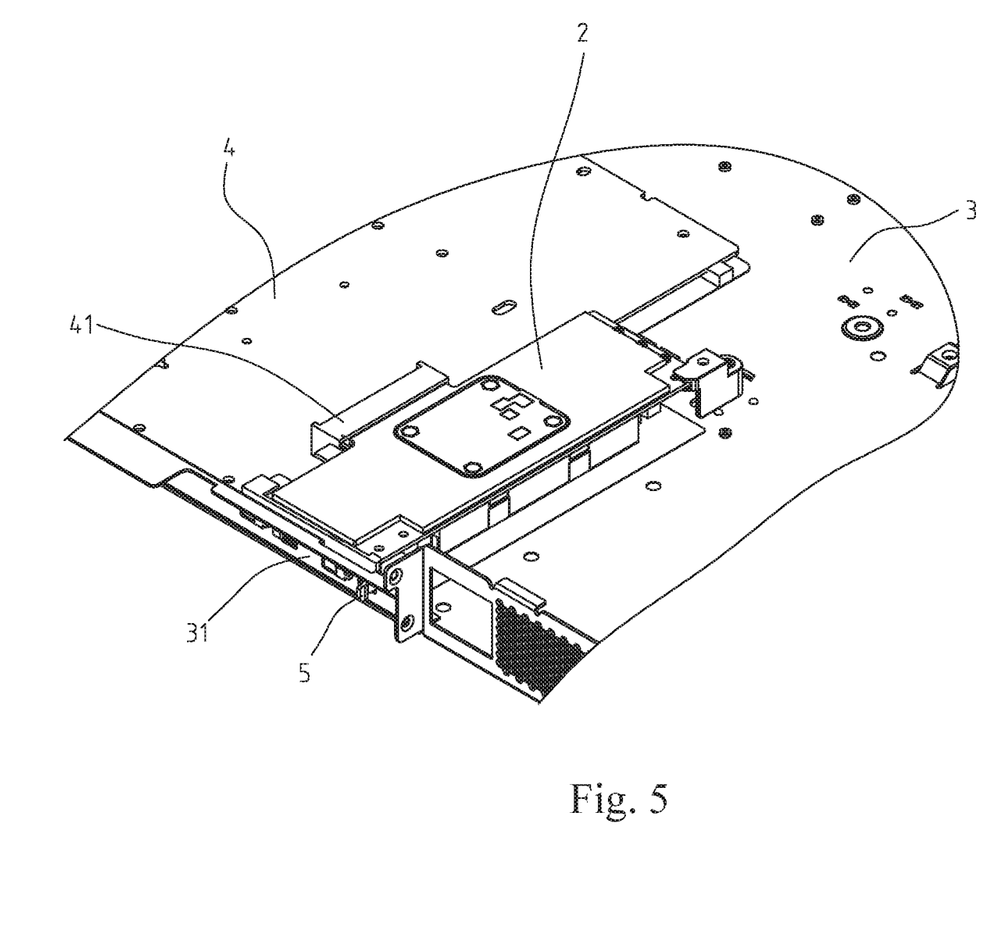
FIG. 5 is a perspective view illustrating an engaging member of an interface card fastening module according to a second embodiment is at an engage position.
Figure 6:
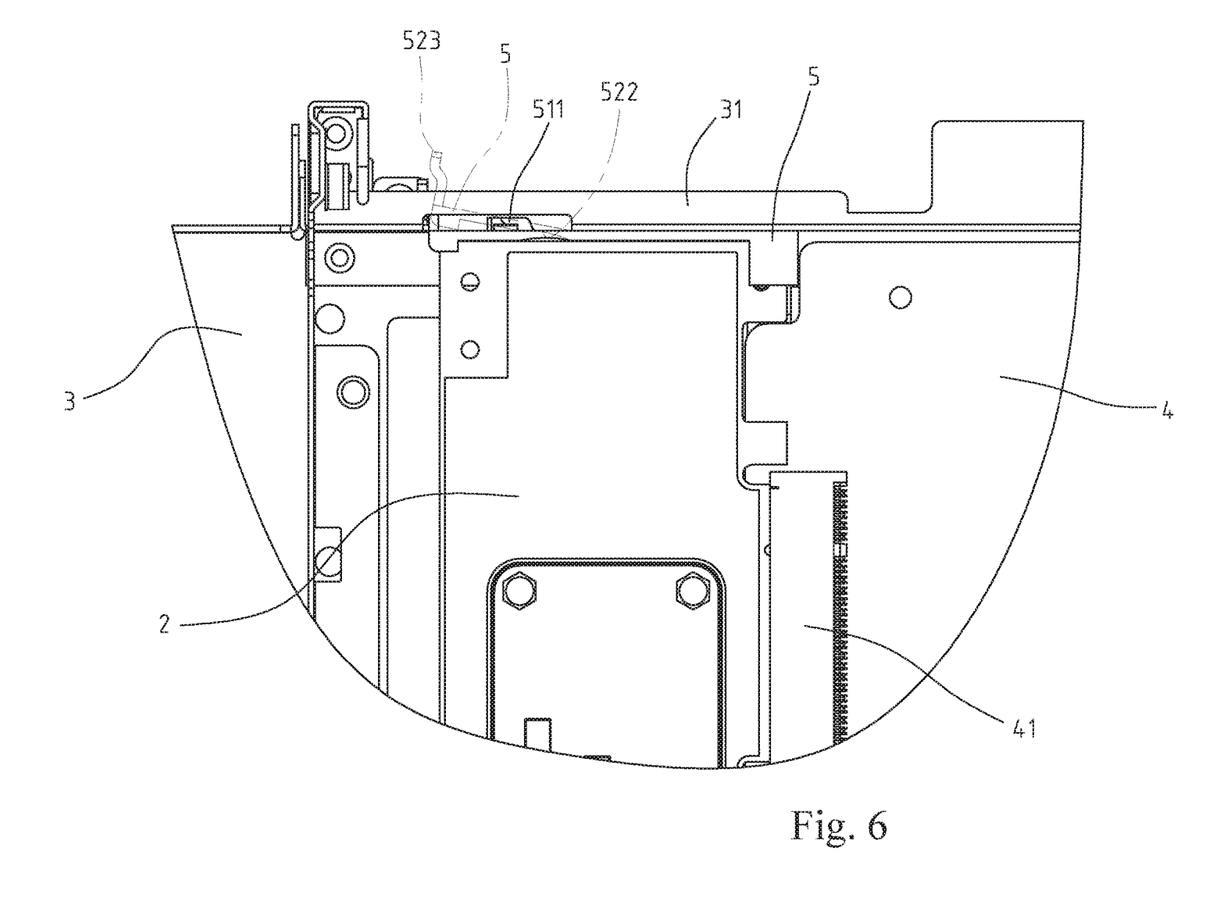
FIG. 6 is a lateral view illustrating the engaging member of the interface card fastening module according to the second embodiment is at a release position.
Figure 7:
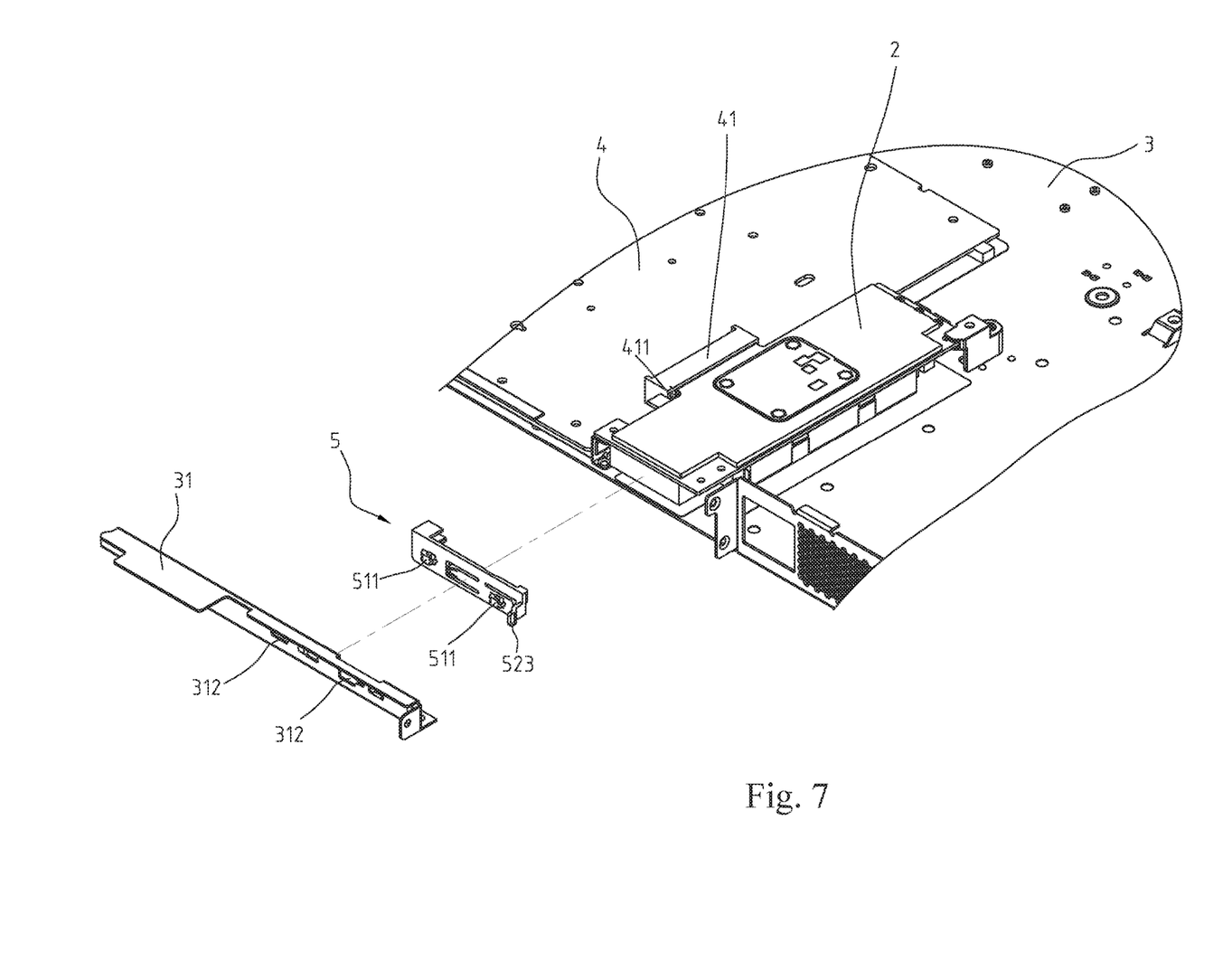
FIG. 7 is an exploded view of the interface card fastening module according to the second embodiment of the instant disclosure.
Figure 8:
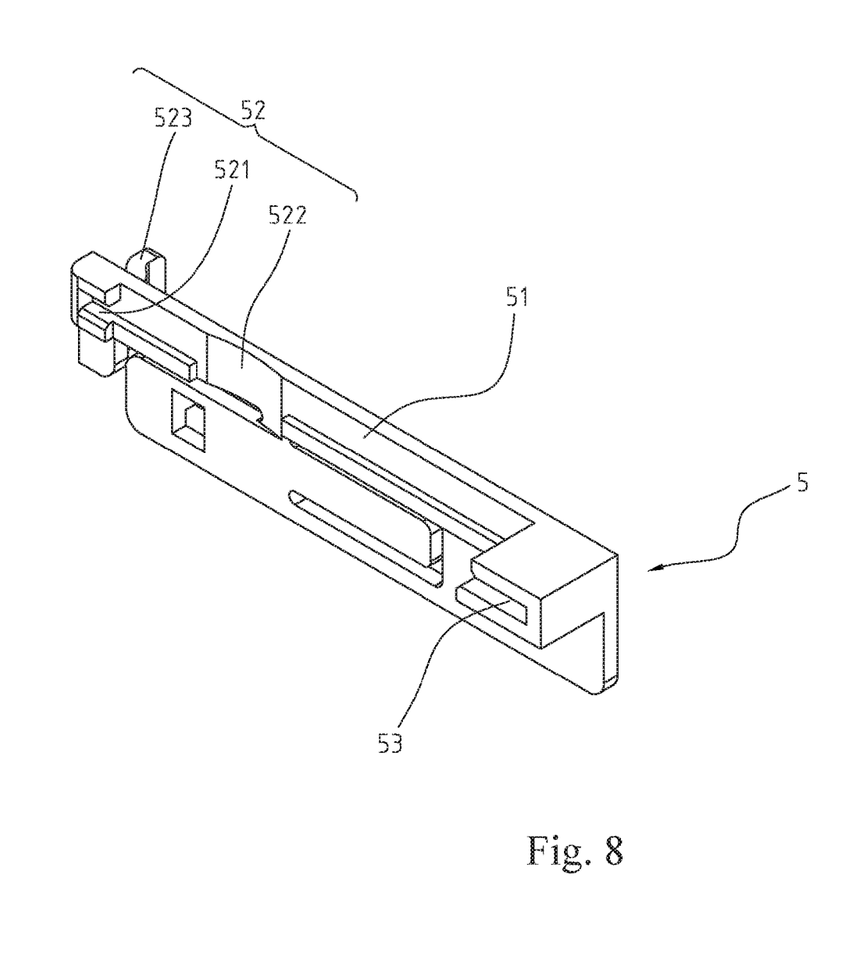
FIG. 8 is an enlarged view of the interface card fastening module according to the second embodiment of the instant disclosure.

Please refer to FIGS. 5 to 8. FIG. 5 is a perspective view illustrating an engaging member 52 of an interface card fastening module 5 according to a second embodiment is at an engage position. FIG. 6 is a lateral view illustrating the engaging member 52 is at a release position. FIG. 7 is an exploded view of the interface card fastening module 5 according to the second embodiment of the instant disclosure. FIG. 8 is an enlarged view of the interface card fastening module 5 according to the second embodiment of the instant disclosure. Identical parts and structures are assigned the same reference numerals as in the first exemplary embodiment, with no further description will be given of these features.

The interface card fastening module 5 is configured to a housing 3 for assembling an interface card 2 and to allow the interface card 2 to be electrically connected with a main board 4 configured to the housing 3. As shown in FIG. 7, the main board 4 has an interface card insertion slot 41 corresponding to the interface card 2, and the plane defined extendingly from the opening of the interface card insertion slot 41 is substantially parallel to the main board 4 (i.e., the top surface of the main board 4). Here, unlike the typical alignment where the interface card 2 is perpendicularly installed to the main board 4, the plane defined extendingly from the opening of the interface card insertion slot 41 in the instant embodiment is aligned to be parallel to the main board 4. Therefore, upon assembling the interface card 2 to the main board 4, an additional adapting member would be not required for changing the assembling direction of the interface card 2 since the assembling direction of the interface card 2 has been changed by the interface card fastening module 5 according to the instant embodiment.

Please refer to FIGS. 7 to 8. The interface card fastening module 5 comprises a body 51, an engaging member 52, and a second engaging groove 53. In this embodiment, the interface card fastening module 5 is assembled to a side wall 31 of the housing 3; specifically, the interface card fastening module 5 is engaged with the side wall 31 of the housing 3. As shown in FIG. 7, two protruding blocks 511 are assembled to the body 51, and two fastening holes 312 are defined at the side wall 31 of the housing 3. When the protruded blocks 511 of the interface card fastening module 5 are respectively passing through the fastening holes 312, the interface card fastening module 5 is then moved relative to the side wall 31 to engage with the side wall 31, so that the interface card fastening module 5 can be secured with the side wall 31 of the housing 3.

The engaging member 52 is flexibly disposed at one of two ends of the body 51 so as to be movable between a release position (as shown in FIG. 5) and an engage position (as shown in FIG. 6), and the engaging member 52 has a first engaging groove 521. The second engaging groove 53 is defined at the other end of the body 51. When the interface card 2 is to be assembled to the main board 4, the interface card 2 is inserted into the interface card insertion slot 41 with a side portion of the interface card 2 being assembled to the interface card fastening module 5. As shown in FIG. 5, in this embodiment, one of the short sides of the interface card 2 is assembled to the interface card fastening module 5, one of two corners of each of the short sides of the interface card 2 is inserted into the second engaging groove 53, and the first engaging groove 521 clamps the other corner of the short side of the interface card 2 when the engaging member 52 is at the engage position.

Based on the interface card fastening module 5 according to the instant embodiment, without the aids of any additional adapting member, the interface card 2 can be assembled to the housing 3 with the assembling direction being parallel to the main board 4. After the interface card 2 is inserted into the interface card insertion slot 41, the engaging member 52 can be moved to the engage position to secure the interface card 2. Therefore, the space for installing an adapting member can be reserved for other components, or, alternatively, the size of the housing 3 may be reduced. On the other hand, since the adapting member is no more needed for the instant embodiment, the manufacturing cost and the assembling hours for the adapting member can be saved. Besides, because the interface card fastening module 5 secures the interface card 2 in an easy way, a user can assemble and disassemble the interface card 2 to the main board 4 easily.

Hereinafter, the structure of the engaging member 52 will be described in detail. Please refer to FIG. 7. The engaging member 52 further comprises an elastic arm 522 and a pressing portion 523. In this embodiment, the body 51 and the engaging member 52 are integrally formed as a whole, and the elastic arm 522 is extending from the body 51. With the elastic force provided by the elastic arm 522, the engaging member 52 can be movable between the release position and the engage position. The pressing portion 523 is perpendicularly extending from the elastic arm 522, and the pressing portion 523 and the first engaging groove 521 are at opposite sides of the elastic arm 522. As shown in FIG. 5, when the interface card fastening module 5 is assembled to the housing 3, the opening of the first engaging groove 521 is faced toward the interior of the housing 3 so as to clamp the interface card 2. While the pressing portion 523 is faced toward the exterior of the housing 3, so that a user may press the pressing portion 523 in an easy and convenient manner to move the engaging member 52 from the engage position to the release position, as shown in FIG. 6.

Figure 9:
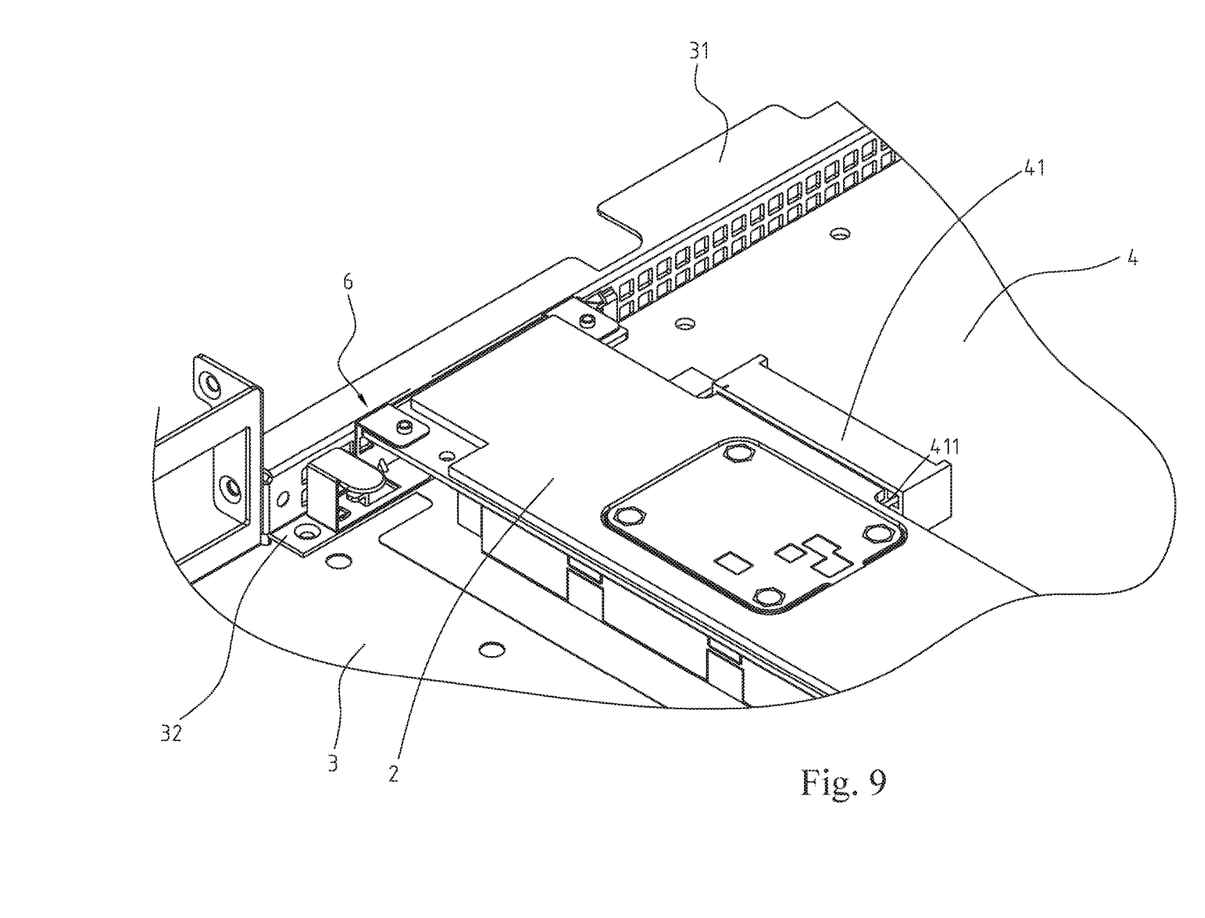
FIG. 9 is a perspective view of an interface card fastening module according to a third embodiment of the instant disclosure.
Figure 10:
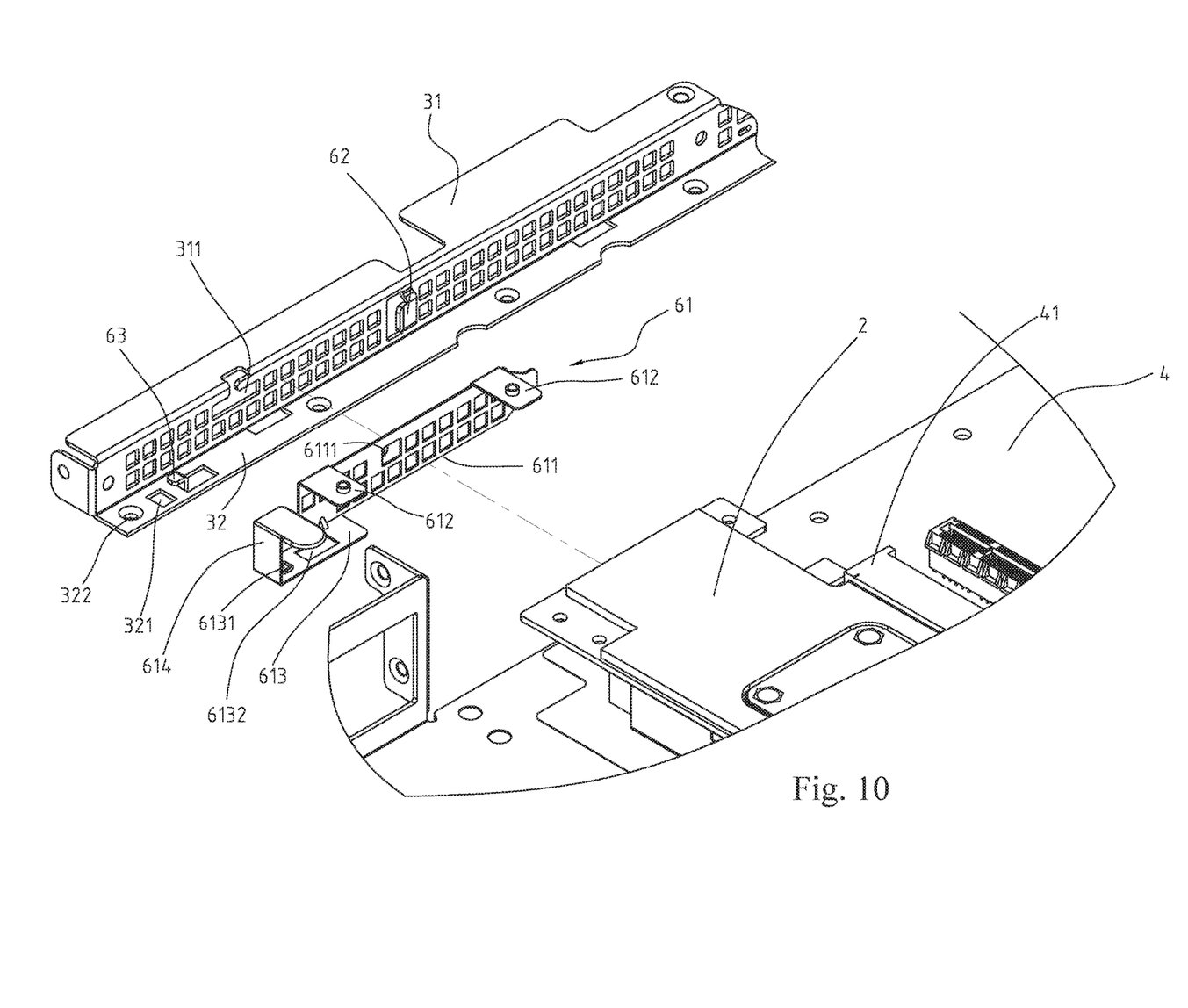
FIG. 10 is an exploded view of the interface card fastening module according to the third embodiment of the instant disclosure.
Figure 11:
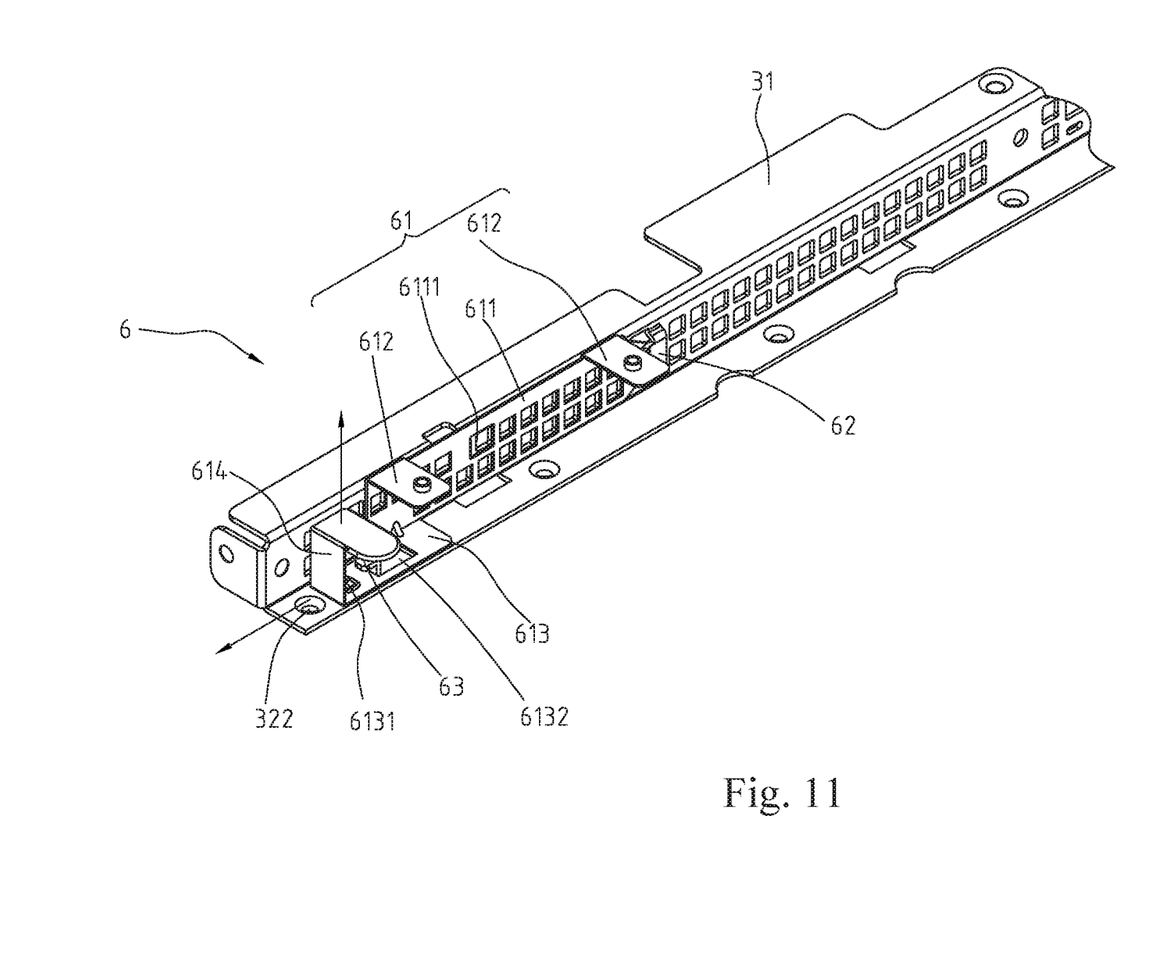
FIG. 11 is an enlarged view illustrating an engaging member of the interface card fastening module shown in FIGS. 9 and 10 is at an engage position.
Figure 12:
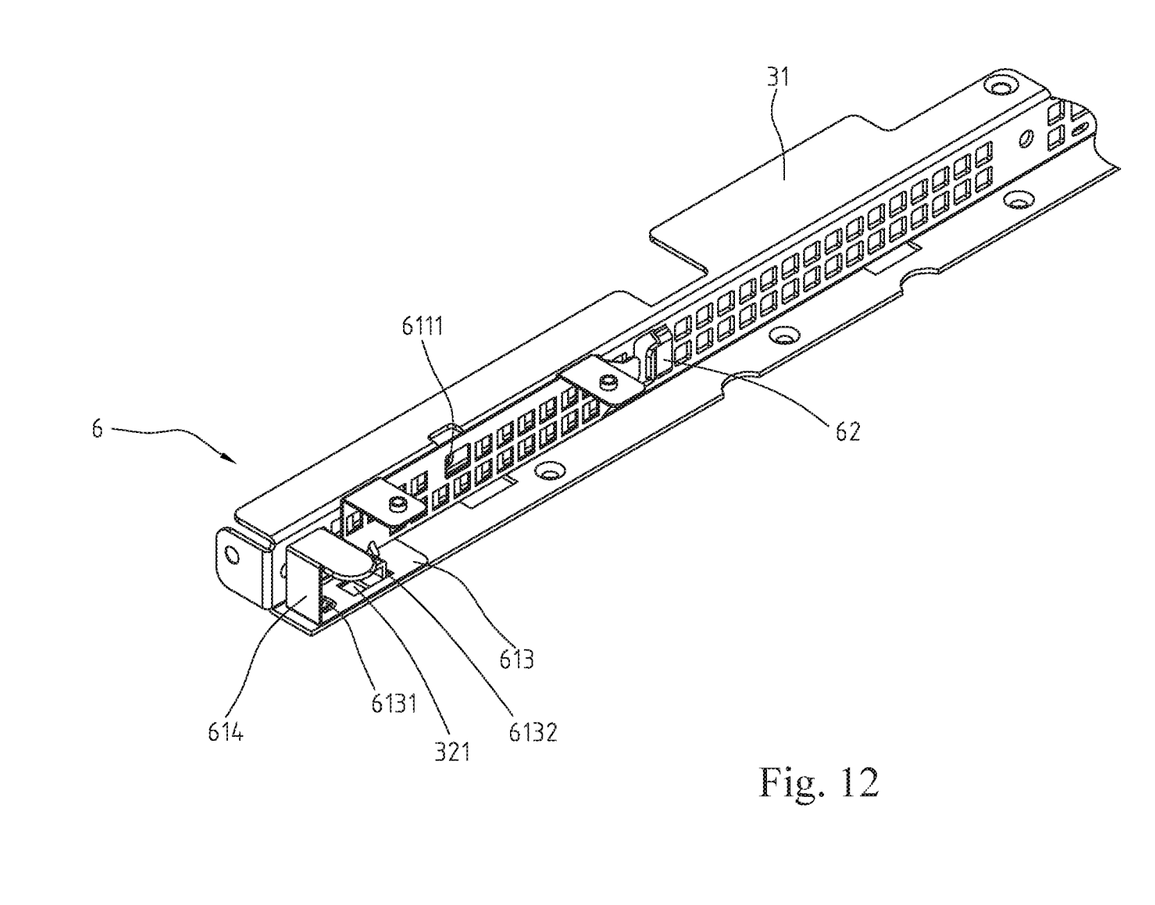
FIG. 12 is an enlarged view illustrating the engaging member of the interface card fastening module shown in FIGS. 9 and 10 is at a release position.

Please refer to FIGS. 9 to 12. FIG. 9 is a perspective view of an interface card fastening module 6 according to a third embodiment of the instant disclosure. FIG. 10 is an exploded view of the interface card fastening module 6. FIG. 11 is an enlarged view illustrating an engaging member 61 of the interface card fastening module 6 is at an engage position. FIG. 12 is an enlarged view illustrating the engaging member 61 is at a release position. Identical parts and structures are assigned the same reference numerals as in the first exemplary embodiment, with no further description will be given of these features.

The interface card fastening module 6 is configured to a housing 3 for assembling an interface card 2 and to allow the interface card 2 to be electrically connected with a main board 4 configured to the housing 3. As shown in FIG. 9, the main board 4 has an interface card insertion slot 41 corresponding to the interface card 2, and the plane defined extendingly from the opening of the interface card insertion slot 41 is substantially parallel to the main board 4 (i.e., the top surface of the main board 4). Here, unlike the typical alignment where the interface card 2 is perpendicularly installed to the main board 4, the plane defined extendingly from the opening of the interface card insertion slot 41 in the instant embodiment is aligned to be parallel to the main board 4. Therefore, upon assembling the interface card 2 to the main board 4, an additional adapting member would be not required for changing the assembling direction of the interface card 2 since the assembling direction of the interface card 2 has been changed by the interface card fastening module 6 according to the instant embodiment.

The interface card fastening module 6 comprises an engaging member 61, a first clamping portion 62, and a second clamping portion 63. The engaging member 61 is assembled to the housing 3 so as to be movable between a release position (as shown in FIG. 12) and an engage position (as shown in FIG. 11). The engaging member 61 comprises a body 611, two lock portions 612, and an extension plate 613. In this embodiment, the number of the lock portion 612 is two, but embodiments are not thus limited. Alternatively, the engaging member 61 may comprise one or more lock portions 612 for locking with the interface card 2. The lock portions 612 are perpendicularly extending from the body 611, and the lock portions 612 are provided for locking the interface card 2 with the engaging member 61. Therefore, the interface card 2 would be moved along with the movement of the engaging member 61. The extension plate 613 is also perpendicularly extending from the body 611 and parallel to the two lock portions 612.

The first clamping portion 62 is disposed at a side wall 31 of the housing 3, and the second clamping portion 63 is disposed at a base plate 32 of the housing 3 in which the base plate 32 is perpendicular to the side wall 3. In this embodiment, as shown in FIG. 11, when the engaging member 61 is at the engage position, the first clamping portion 62 clamps the front end of the body 611. The second clamping portion 63 is a hook shaped structure assembled to the base plate 32 of the housing 3. When the engaging member 61 is moved to the engage position, the second clamping portion 63 clamps the extension plate 613 and abutted against the extension plate 613. When the interface card 2 is to be secured, the interface card 2 is locked to the lock portion 612, and the engaging member 61 is moved from the release position to the engage position. At this moment, the first clamping portion 62 clamps the front end of the body 611, and the second clamping portion 63 clamps and abuts against the extension plate 613, such that the engaging member 61 can be positioned at the engage position.

Based on the interface card fastening module 6 according to the instant embodiment, without the aids of any additional adapting member, the interface card 2 can be assembled to the housing 3 with the assembling direction being parallel to the main board 4. After the interface card 2 is inserted into the interface card insertion slot 41, the engaging member 61 can be moved to the engage position to secure the interface card 2. Therefore, the space for installing an adapting member can be reserved for other components, or, alternatively, the size of the housing 3 may be reduced. On the other hand, since the adapting member is no more needed for the instant embodiment, the manufacturing cost and the assembling hours for the adapting member can be saved. Besides, because the interface card fastening module 6 secures the interface card 2 in an easy way, a user can assemble and disassemble the interface card 2 to the main board 4 easily.

To strengthen the engagement of the engaging member 61, the body 611 of the engaging member 61 has a third clamping portion 6111, and the side wall 31 of the housing 3 defines a hole 311 therethrough. When the engaging member 61 is at the engage position, the third clamping portion 6111 passes through the hole 311 to clamp the side wall 31.

In addition, to prevent the engaging member 61 at the engage position from moving to the release position upon being shaken or upon the movement of the housing 3, the extension plate 613 of the engaging member 61 has a positioning protruded portion 6131, and the base plate 32 of the housing 3 has a positioning recess 321. Accordingly, when the engaging member 61 is at the engage position, the positioning protruded portion 6131 is correspondingly received in the positioning recess 321. In other words, when the engaging member 61 is moved to the engage position, the positioning protruded portion 6131 located at the extension plate 613 and facing toward the base plate 32 of the housing 3 would fall into the positioning recess 321 of the base plate 32. As a result, the engaging member 61 cannot be moved to the release position unless the engaging member 61 is lifted. Therefore, the engaging member 61 can be positioned at the engage position.

As mentioned, in the instant embodiment, to enable the engaging member 61 to be moved to the release position, the engaging member 61 further comprises an operating piece 614 perpendicularly extending from the extension plate 613. As shown in FIG. 10, the operating piece 614 is an L-profiled structure upward extending from the extension plate 613 for moving the engaging member 61 easily. Alternatively, the operating piece 614 may be a rod for holding so as to move the engaging member 61 easily. For operation, as shown in FIG. 11, when the engaging member 61 is moved from the engage position to the release position, the user holds the operating piece 614 to lift the engaging member 61 upward so that the positioning protruded portion 6131 of the extension plate 613 would detach from the positioning recess 321 of the base plate 32. And then, the user may move the operating piece 614 to move the engaging member 61 to the release position.

Additionally, to allow the engaging member 61 to be moved linearly between the engage position and the release position, the extension plate 613 may have a positioning hole 6132. Accordingly, when the engaging member 61 is at the engage position, the second clamping portion 63 passes through the positioning hole 6132 to be at one end of the positioning hole 6132, and the second clamping portion 63 clamps the extension plate 613. During the movement of the engaging member 61 from the engage position to the release position, the engaging member 61 is moved linearly without deviation by the limiting of the positioning hole 6132 and the second clamping portion 63.

Moreover, the base plate 32 may further comprise a positioning recess 322. When the engaging member 61 is moved to the release position, the positioning protruded portion 6131 located at the extension plate 613 and facing toward the base plate 32 of the housing 3 would fall into the positioning recess 322 of the base plate 32. As a result, the engaging member 61 cannot be moved to the engage position unless the engaging member 61 is lifted. Therefore, the engaging member 61 can be positioned at the release position temporarily.

While the instant disclosure has been described by way of example and in terms of the preferred embodiments, it is to be understood that the invention needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:

1. An interface card fastening module, provided for assembling an interface card to a housing and for electrically connecting the interface card with a main board, wherein the main board has an interface card insertion slot corresponding to the interface card, and a plane defined extendingly from an opening of the interface card insertion slot is substantially parallel to the main board, wherein the interface card fastening module comprises:
    an engaging member disposed at the housing so as to be movable between a release position and an engage position, wherein the engaging member comprising a body, at least one lock portion, and an extension plate, wherein the lock portion is perpendicularly extending from the body, and the extension plate is perpendicularly extending from the body and parallel to the lock portion;
    a first clamping portion; and
    a second clamping portion, assembled to be disposed along a base plate of the housing, wherein the first clamping portion is disposed perpendicular to the base plate of the housing;
    wherein, the interface card is locked with the lock portion, and wherein when the engaging member is at the engage position, the first clamping portion clamps the body and the second clamping portion clamps the extension plate.

2. The interface card fastening module according to claim 1, wherein the body has a third clamping portion, and the side wall defines a hole therethrough, wherein when the engaging member is at the engage position, the third clamping portion passes through the hole to clamp the side wall.

3. The interface card fastening module according to claim 1, wherein the extension plate of the engaging member has a positioning protruded portion, and the base plate of the housing has a positioning recess, wherein when the engaging member is at the engage position, the positioning protruded portion is correspondingly received in the positioning recess.

4. The interface card fastening module according to claim 1, wherein the engaging member further comprises an operating piece perpendicularly extending from the extension plate.

5. The interface card fastening module according to claim 1, wherein the extension plate has a positioning hole, wherein when the engaging member is at the engage position, the second clamping portion passes through the positioning hole to be at one end of the positioning hole, and the second clamping portion clamps the extension plate.

* * * * *